(12) United States Patent
Wilsher

(10) Patent No.: US 6,501,288 B1
(45) Date of Patent: Dec. 31, 2002

(54) ON-CHIP OPTICALLY TRIGGERED LATCH FOR IC TIME MEASUREMENTS

(75) Inventor: Kenneth R. Wilsher, Palo Alto, CA (US)

(73) Assignee: Schlumberger Technologies, Inc., San Jose, CA (US)

( * ) Notice: Subject to any disclaimer, the term of this patent is extended or adjusted under 35 U.S.C. 154(b) by 76 days.

(21) Appl. No.: 09/675,090

(22) Filed: Sep. 28, 2000

(51) Int. Cl.⁷ .............................................. G01R 31/308
(52) U.S. Cl. ..................... 324/753; 324/515; 324/751; 324/752
(58) Field of Search ................ 324/752, 753, 324/76.36, 244.1, 305, 304, 452, 515, 751, 559; 356/495, 752, 237, 369; 156/345.5; 438/8

(56) References Cited

U.S. PATENT DOCUMENTS 4,480,916 A * 11/1984 Bareket ..................... 356/495
4,758,092 A *  7/1988 Heinrich ..................... 356/364
4,967,152 A * 10/1990 Patterson ..................... 324/752

* cited by examiner

Primary Examiner—Michael Sherry
Assistant Examiner—Trung Nguyen
(74) Attorney, Agent, or Firm—Skjerven Morrill LLP; Norman R. Klivans

(57) ABSTRACT

Method and on chip circuitry for testing integrated circuits, for instance, flip chip integrated circuits. Provided on the integrated circuit in addition to the conventional circuitry is additional circuitry including a photosensitive element such as a photodiode, the output terminal of which is connected via a Schmidt trigger to the clock terminal of an on-chip flip-flop. The node of the integrated circuit to be tested, for instance, the output terminal of a logic gate, is connected to the D input terminal of the same flip-flop. Hence, light incident on the photosensitive element clocks the flip-flop, allowing sampling of the state of the output signal from the logic gate. Advantageously, the photodiode need not be a specially made structure but in one version is the conventional PN junction provided by, e.g., the drain of a standard CMOS transistor.

16 Claims, 10 Drawing Sheets

DISPLAYED LOGIC SAMPLES SHOWING NO JITTER

DISPLAYED LOGIC SAMPLES SHOWING JITTER

DISPLAYED LOGIC SAMPLES

PASS ○
FAIL ×

FIG. 8E
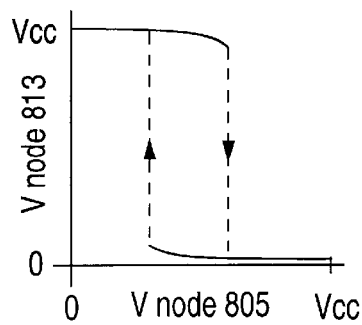
DC Characteristic of Inverter with hysterysis
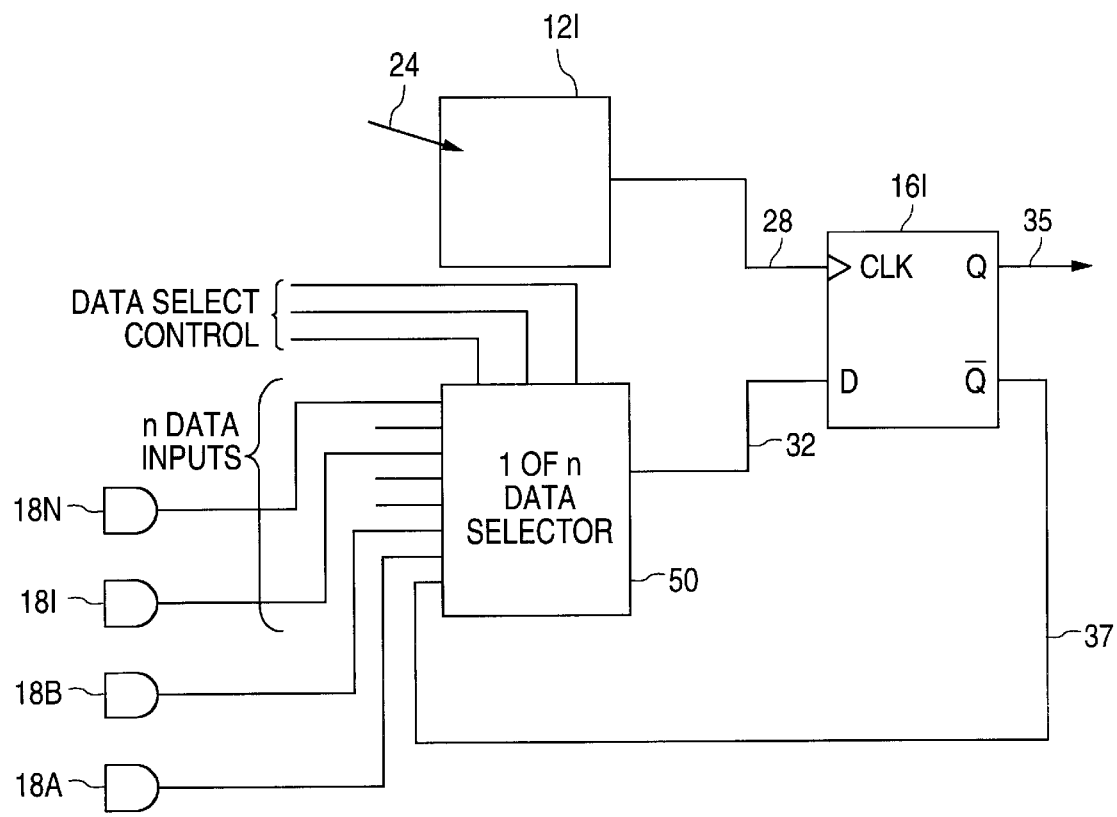
FIG. 9

ON-CHIP OPTICALLY TRIGGERED LATCH FOR IC TIME MEASUREMENTS

BACKGROUND

1. Field of the Invention

This disclosure relates to testing of integrated circuits, in particular to measurements of voltage transitions on internal nodes of integrated circuits.

2. Description of the Related Art

Measurements of voltage transitions on internal circuit nodes are needed during the development and testing of complex integrated circuits ("ICs" hereafter). In some instances mechanical probing and beam (electron beam) probing can provide the requisite information. However, when flip-chip packaging technology is used, mechanical and beam probe access to the front (metal connection) side of the IC die is blocked.

It is known to use a light beam to measure voltage at an internal circuit node in a conventional flip-chip packaged IC. (An example of a circuit mode is an output or input terminal of a logic gate but it may be any point on an electrical connection in the circuitry on the IC.) An example of a conventional system for measuring circuit voltage at an internal circuit node of an IC using light is the IDS2000 system manufactured by Schlumberger Limited, and described in U.S. Pat. No. 5,905,577. Such a light beam is focused on a circuit element such as a diode (P-N junction) in the IC where the measurements are desired. The diode is electrically connected to the circuit node. At the same time, the IC is conventionally exercised by applying to its input terminals electrical signals in the form of commands defining test patterns. In response to the applied test patterns (vectors), voltage transitions take place at the circuit node, which is merely a point on an electrical connection to the circuit element. The light reflected from the circuit element is modulated by changes in the electrical state of the circuit node, in response to the test patterns. Thus the reflected light provides a measure of voltage transitions (signals) at the circuit node.

There are drawbacks associated with this method. First, the modulation of the reflected light beam is very weak and averaging techniques must be used to obtain low noise measurement waveforms. Second, as semiconductor device (transistor) feature sizes shrink on ICs, it is expected that this modulation will become weaker. Third, many circuit problems are intermittent, (e.g., in logic circuits) so that test averaging will produce false results unless the IC activity is exactly repeated for every test pattern cycle.

Electrical access to such internal circuit nodes can be achieved by providing an on-chip circuit called a scan chain. This test method modifies the otherwise conventional flip-flops used in the IC, providing a two input data selector to the D input terminal of each flip-flop. The data selector control signal for all the flip-flops is a common signal called Scan Enable. With Scan Enable in the low logic state, the data selector is set for normal IC operations. However, the Q output terminal of each flip-flop is coupled to the normally unused data selector input of another flip-flop. When Scan Enable is in the high logic state this path is enabled, forming a continuous shift register structure from all the modified and connected flip-flops. Thus serial data representing an arbitrary logic state can be loaded from one of the IC input pins into the shift register with Scan Enable high, and normal IC operation begun from this arbitrary internal state by switching Scan Enable low. Also at any point in the normal operation of the IC, Scan Enable can be made logic high, thus latching the logic state of all internal nodes into the shift register. The contents of the shift register can then be clocked to an output pin for analysis. For a detailed description of scan test methods see Alfred L. Crouch, "Design For Test For Digital IC's And Embedded Core Systems," Prentice Hall, 1999.

However, the scan chain operations cannot be performed at full device operating speed. Thus at low speed all faults may be located, but faults occurring only at high speed may elude isolation in time and position. Latching of the scan chain can be done with the DUT (device under test, referring to the IC under test) operating at full clock speed, thereby obtaining a "snap shot" of the IC internal nodes at an instant in time. However, it is difficult to distribute simultaneously to the scan chain the latching clock pulse, or at least distribute the latching clock pulse within a small fraction of the device clock period. Because of this, the data obtained in this manner is suspect. The on-chip time relationship between voltage transitions on two nodes is not accurately represented in the data obtained in this manner. This latching pulse skew distribution problem becomes worse as the number of active circuits contained in a DUT (Device Under Test) increases.

Thus it is desirable to provide high timing accuracy diagnostic latching ability inside a DUT to obtain reliable measurements of faults occurring at high speed and also intermittent faults. It is desirable to provide high timing accuracy latching at any location in a DUT, and to provide high timing accuracy latching simultaneously at two or more nodes. It is further desirable to provide high timing accuracy latching with a predetermined and controlled delay.

SUMMARY

This disclosure is directed to a method and apparatus that overcome aforesaid shortcomings of the prior art. The method and apparatus are non-invasive and non-destructive of the IC under test and do not affect normal operation of the IC.

This disclosure is mostly directed to testing of, e.g., flip-chip packaged integrated circuits (ICs) and also conventionally packaged ICs with access to the backside of the IC die (the die is the semiconductor substrate without its leads, heat sink, or package). Each IC to be tested using the method and apparatus of this disclosure is fabricated with on-chip light sensitive devices, such as diodes. The light sensitive devices are each electrically coupled to one or more on-chip (on-die) D type flip-flops (flip-flops hereafter) or similar storage elements. Each circuit node whose electrical state is of interest is also coupled to one of the flip-flops. The IC device under test (DUT) is prepared for testing by opening the package, thereby exposing the backside of the die without disturbing its electrical functioning. The back side is the side opposite the principal surface on which the transistors are formed. In case of a flip-chip package, the backside is the side opposite the surface on which the bond between the die and the substrate is formed. The exposed die surface can be thinned, polished, and anti-reflection coated to improve optical transmission. In one embodiment, the light sensitive devices (e.g., photodiodes) are spaced apart from the remainder of the IC circuitry and from each other so that, e.g., laser illumination incident thereon can be focused thereon without need for extreme accuracy in terms of location.

A die packaged to allow optical access to the front surface only could also tested by the described method, if the optical path to the light sensitive element was clear of opaque obstructions such as metal lines and power planes. A detailed description of relevant chip mounting technologies is given in "Low Cost Flip Chip Technologies" by John H. Lau, McGraw Hill 2000.

The DUT, prepared as described above, is conventionally exercised (tested) by a suitable computer generated test program run on an IC test apparatus applying a test pattern to the signal input pins (terminals) of the DUT. While the test pattern is being run, a light pulse is directed by conventional beam steering and focusing optics in the test apparatus through the exposed backside surface of the DUT die onto one or several of the on-chip light sensitive devices. In response, each such light sensitive device generates an electrical pulse. This electrical pulse is used as clock pulse to latch the logic state of the associated circuit node at the instant of the clock pulse into an associated on-chip flip-flop. The logic state of the circuit node at the instant of the clock pulse is thus stored in the flip-flop, and can be read out later. The readout can be accomplished by having a direct connection between each flip-flop output terminal and one of the DUT pins. Another readout method is to use a conventional scan chain. In this case the flip-flop output terminals are treated as extra nodes whose state can be read out serially by using additions to the DUT scan chain. The pin count of the DUT is not increased.

After the data in each such flip-flop is readout and stored in the conventional data analysis equipment associated with the test apparatus, the cycle is repeated. The cycle of running the test pattern, sampling, and storing can be repeated many times with the sampling time having different values each repetition. The stored results represent the change in logic state of the tested node during these times. The light pulse can be directed at light sensitive devices at separate locations on the DUT without any appreciable change in its time of arrival at these various locations. Therefore it is possible to obtain logic data from widely separate circuit nodes with confidence that the recorded time relationships are a very accurate representation of the actual on-chip electrical activity.

Further features and advantages will appear more clearly on a reading of the detailed description, which is given below by way of example only and with reference to the accompanying drawings.

BRIEF DESCRIPTION OF THE DRAWINGS

FIG. 8E shows DC characteristics of the inverter shown in FIGS. 8C and 8D.

FIG. 9 illustrates a self-test apparatus for the elements of FIG. 1.

DETAILED DESCRIPTION

This application relates to and incorporates by reference in its entirety the commonly-assigned co-pending U.S. patent application entitled "Optical Coupling for Testing Integrated Circuits" invented by Kenneth R. Wilshire, application Ser. No. 09/746,618, filed Dec. 21, 2000.

Figure 1:
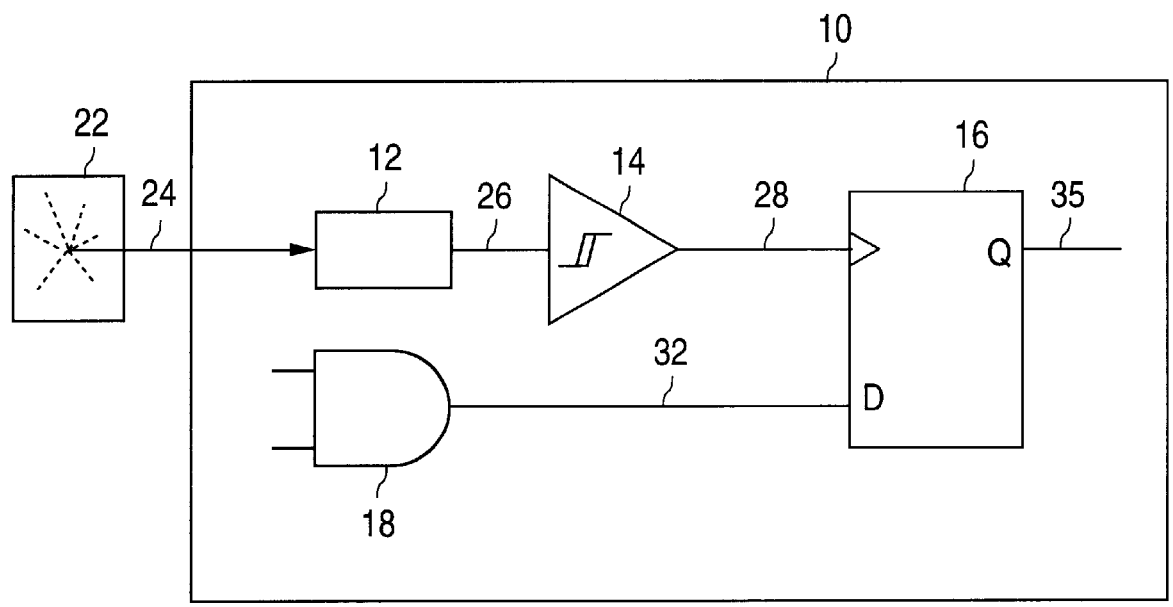
FIG. 1 is a schematic diagram of circuitry of a device under test in accordance with this disclosure.

This disclosure is directed to a method and apparatus for testing ICs. FIG. 1 illustrates in a schematic diagram the elements of a (small) portion of relevant circuitry on an IC DUT 10. On the principal surface of DUT 10 are a number of light sensitive devices (elements) 12 only one of which is shown here. It is to be understood that DUT 10 is typically a flip chip packaged IC or a conventionally packaged ICs with optical access to the light sensitive elements as described above, and is for instance a microprocessor, memory chip, logic chip, etc. and the conventional circuitry present thereon is not illustrated. Additionally, the circuitry of FIG. 1 is electrically coupled to a circuit node ("node") of that conventional circuitry and is replicated many times on a single IC DUT 10. Each light sensitive element 12 is, in accordance with this disclosure, electrically coupled to the input terminal of a Schmitt trigger 14. Trigger 14 inherently has hysteresis to avoid multiple transitions of its output signal due to possibly very slow fall time of the input signal (FIG. 8C illustrates inter alia an exemplary embodiment of trigger 14 including inverter 819 and resister 817, which provide the hysteresis). The output terminal of trigger 14 in FIG. 1 is coupled to the clock input terminal of flip-flop 16. Flip-flop 16 also receives at its D input terminal an input signal from a logic circuit 18 of the conventional IC circuitry (here shown as an exemplary AND gate). The Q output terminal of flip-flop 16 is coupled by line 35 to an output device. When several logic circuits 18 on DUT 10 are to be tested, an equal number of circuits similar to that of FIG. 1 are replicated on DUT 10.

A typical test is described here with respect to one logic circuit node; it is to be understood that when several circuit nodes are to be tested, the same process can be used for each node. A light source 22 (part of the test apparatus) generates a light pulse 24 and focuses it on light sensitive element 12 through the backside of DUT 10 that has been prepared as described above. (Light sensitive element 12 is fabricated as part of the circuitry on DUT 10.) Light sensitive element 12 in response to the incident light pulse 24 generates an electrical pulse on line 26. Line 26 is coupled to the input terminal of trigger 14. Trigger 14 also acts as an amplifier and a shaping circuit which provides a logic output signal on its output terminal line 28 which is coupled to flip-flop 16 as a clock pulse. The D input terminal of flip-flop 16 is coupled to the output terminal of logic circuit 18 via line 32. Logic circuit 18 outputs a signal on line 32 in response to a test pattern applied to the input terminals of DUT 10. Flip-flop 16 consists of a master stage (master flip-flop) and a slave stage (slave flip-flop). Flip-flop 16 sets the state of its internal master flip-flop when the clock pulse is low and at the rising edge of the clock pulse transfers the state of its internal master flip-flop to its internal slave flip-flop. Thus, the signal on output line 32 of logic circuit 18 is sampled at time T1, the time at which light pulse 24 impinged upon light sensitive element 12, and is stored in the slave flip-flop. The output signal of logic circuit 18 is sampled at time T1 and stored in the slave flip-flop indefinitely. The time relationship between the light pulse and the state of logic circuit 18 are discussed in further detail later. The state of the slave flip-flop is available on line 35 to pass to an output pin of DUT 10 for further processing, via a multiplexer tree, or via a scan chain (not shown).

The performance of flip-flop 16 is affected by the time interval between the data input changing at the slave flip-flop and the rising edge of the clock pulse. For normal performance of flip-flop 16, a data setup time and a data hold time are specified. The setup time and hold time are violated as the light generated pulse 28 is scanned over the logic transitions of the output waveform on line 32 applied to the D input terminal of flip-flop 16 causing excessively long settling time of the flip-flop. This "metastability" has been studied; see West, B., Accuracy Requirements in At-Speed Testing, International Test Conference Proceedings 780 (1999) (IEEE catalog number 99CH37034), incorporated herein in its entirety, which shows that a stable flip-flop output value is achieved in nanoseconds. West also found that for ECL logic, and using the final output state of the flip-flop as an indicator, the time position of the data change at the D flip-flop output terminal could be determined to a very high, sub-picosecond resolution and very high repeatability by scanning the clock pulse time over the data transition time. To practice the present method, in one embodiment the time positions of data changes are determined to a sub-nanosecond resolution with very high repeatability using a flip-flop.

Figure 2:
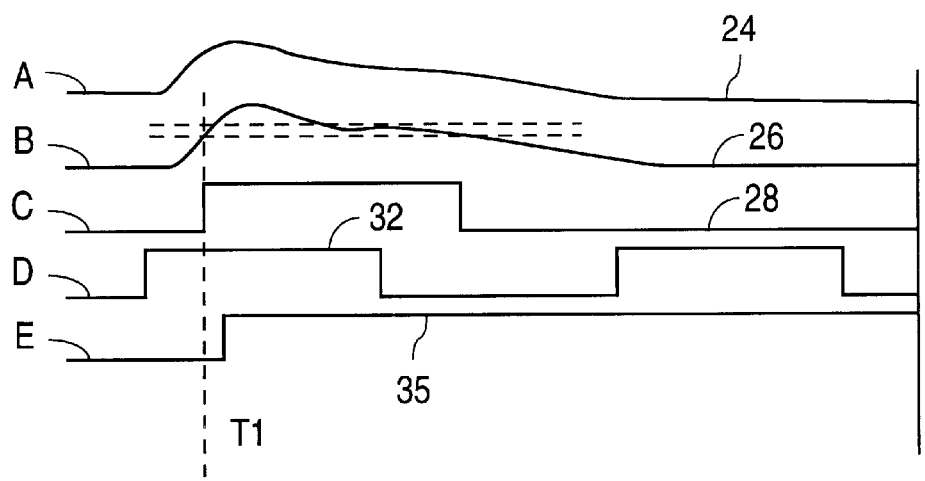
FIG. 2 is a timing diagram showing the time relationship between various signals in FIG. 1.

FIG. 2 shows a timing diagram for certain specified nodes of the FIG. 1 circuit. Waveform A in FIG. 2 represents light pulse 24 (signal amplitude vertical scale, time horizontal scale). Waveform B represents the electrical pulse on line 26 output by light sensitive element 12 in response to light pulse 24. Waveform signal C represents the output signal of trigger 14 on line 28 in response to electrical pulse 26. Waveform D represents the signal output of logic circuit 18 on line 32 in response to the test pattern applied to DUT 10. Waveform E represents the output signal on line 35 of flip-flop 16 (i.e., the state of the slave flip-flop in the time domain). Waveform B shows the rising edge of the electrical pulse being generated by the leading edge of the light pulse, however, the trailing edge of the light pulse can also be used if it can be sufficiently sharply defined. Note that the logic level of E prior to time T1 is indeterminate in fact, but shown here as being zero.

Figure 3:
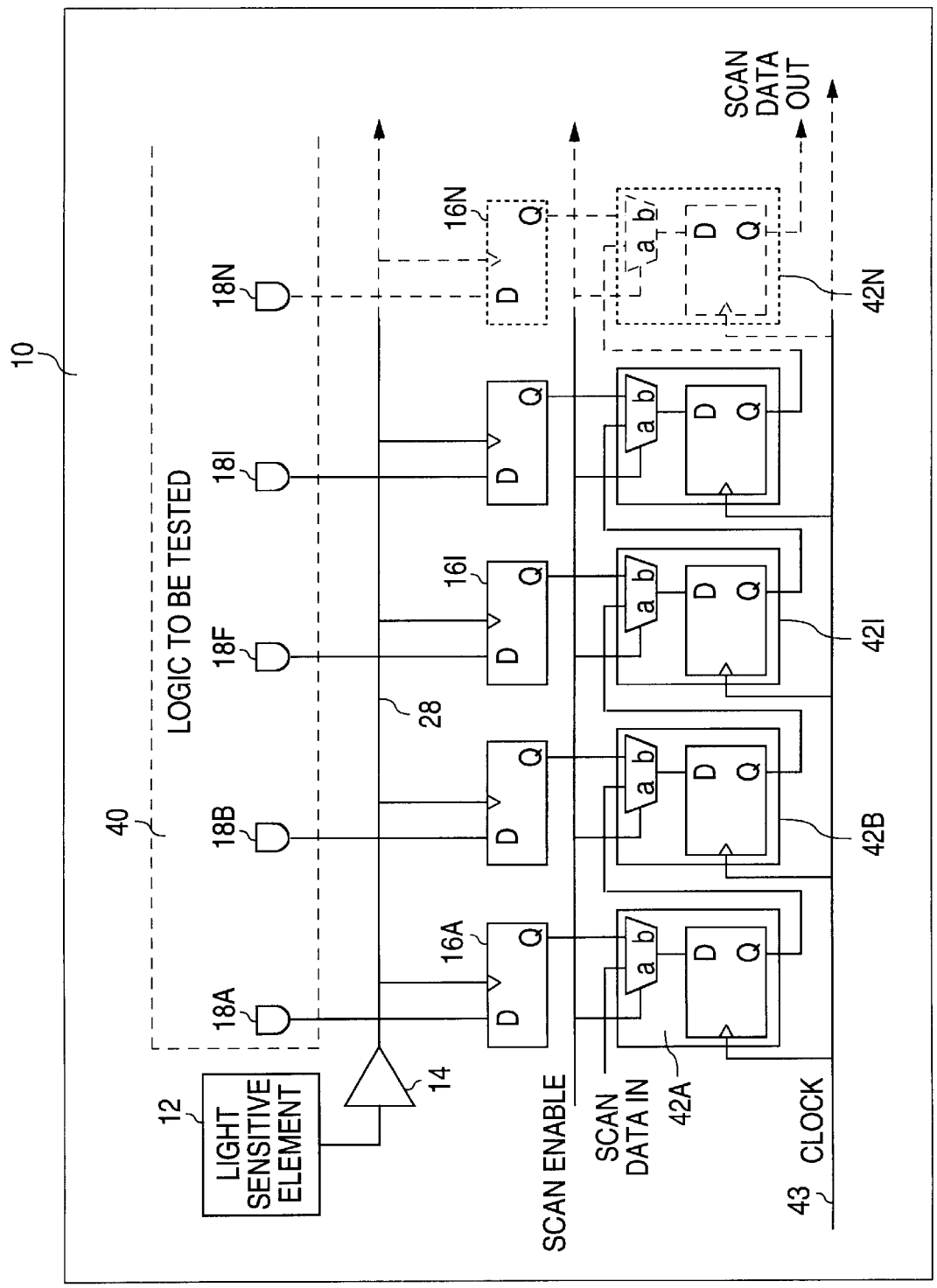
FIG. 3 is a schematic diagram of a portion of the device under test showing connection between the elements shown in FIG. 1 and a scan chain.

FIG. 3 is a schematic diagram of a portion of DUT 10 showing an exemplary connection between the elements shown on FIG. 1 and a scan chain. Logic 40 includes several logic circuits 18 to be sampled. Each logic circuit, 18A, . . . , 18B, . . . , 18I, . . . , 18N is coupled to one associated flip-flop 16A, . . . , 16I . . . , 16N. Light sensitive element 12 is coupled to trigger 14 and the logic output signal on line 28 of trigger 14 is coupled to the clock input terminals of flip-flops 16A, . . . , 16I . . . , 16N. Thus, a single incident light pulse 24 could generate a logic output signal on line 28 which is used as a latch pulse for a multi-bit latch, thereby enabling simultaneous recording of the state of an address bus or data bus flip-flops 16A, . . . , 16N. The output signal of Flip-flops 16A, . . . , 16I . . . , 16N are latched into the scan chain (of the type described above) including multiplexed registers (flip flops) 42A, . . . , 42I . . . , 42N. Several flip-flops 16A, . . . , 16I . . . , 16N may be located (see FIG. 4) throughout DUT 10.

Figure 4:
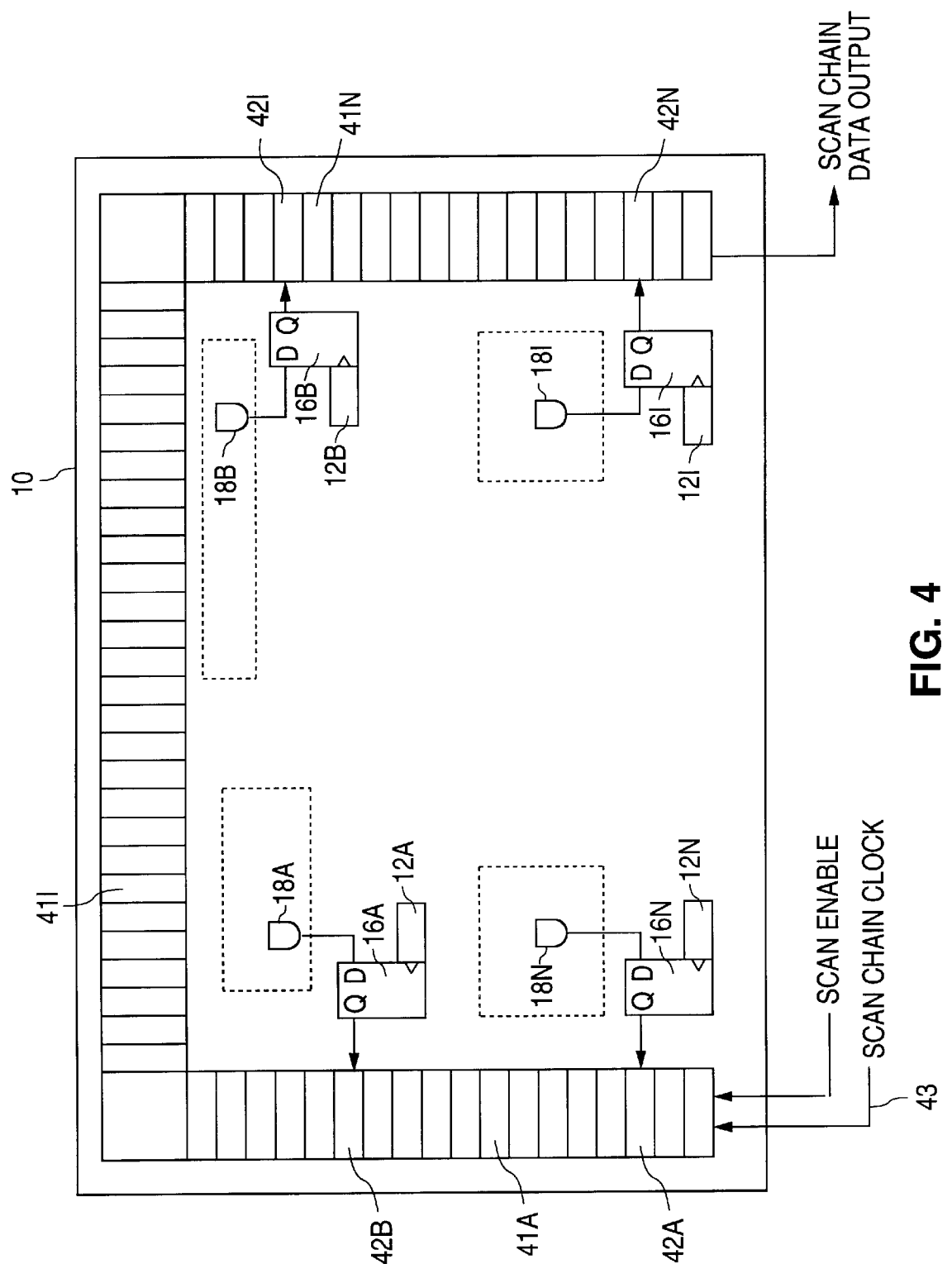
FIG. 4 is a schematic diagram of a portion of the device under test illustrating elements shown in FIG. 1 and a scan chain.

FIG. 4 shows schematically another embodiment where DUT 10 includes a scan chain having elements 41A, . . . , 41I . . . , 41N, and several light sensitive elements 12A, . . . , 12I . . . , 12N coupled respectively to flip-flops 16A, . . . , 16I . . . , 16N. Light sensitive elements 12A, . . . , 12I, . . . , 12N may be physically separated on DUT 10. Light pulse 24 of FIG. 1 is focused on the light sensitive elements, thereby causing storing of the output signal of each logic circuit as described previously. This data from different logic circuits 18A, . . . , 18I, . . . , 18N has accurate time relationships with respect to light pulse 24. By using several light pulses, and directing them at respectively light sensitive elements 12A, . . . , 12I, . . . , 12N simultaneously or with a set delay, output signals from logic circuits 18A, . . . , 18I, . . . , 18N at the same time or separated by a set time can be stored, and correlation between them can be performed.

Figure 5A:
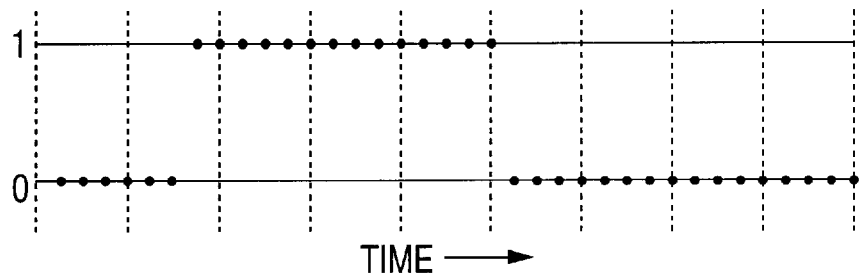
FIG. 5A is a diagram of a logic signal showing no jitter.
Figure 5B:
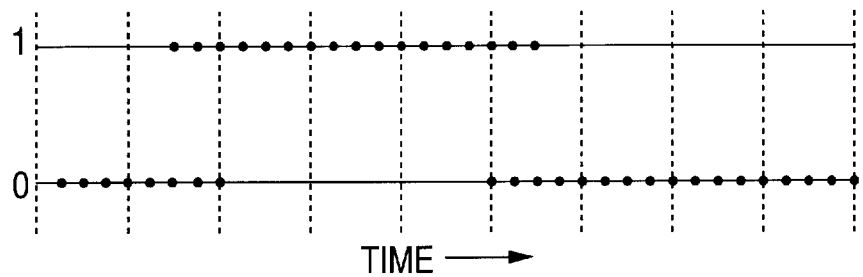
FIG. 5B is a diagram of a logic signal showing jitter.
Figure 5C:
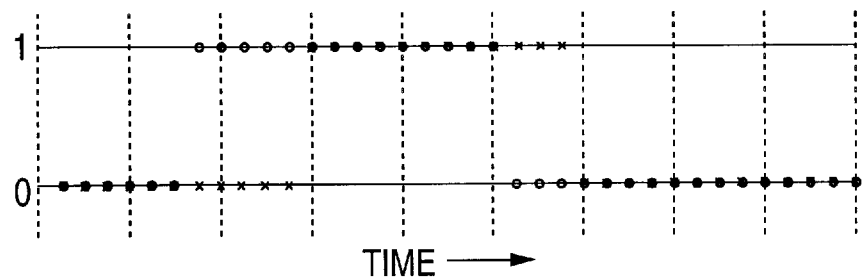
FIG. 5C is a diagram of a logic signal showing intermittent fault.

By sampling the output of logic circuit 18I of DUT 10 over the range of time of interest, logic state jitter can be measured. FIG. 5A shows a plot of the logic state of logic circuit 18I that does not exhibit jitter. FIG. 5B shows a plot of the logic state of logic circuit 18I that does exhibit jitter, over a period of time. FIG. 5C shows a plot of logic state of logic circuit 18I wherein each data point recorded for the probed node is tagged with a pass/fail indicator, and the data displayed so as to distinguish the fail condition on the node by marking the displayed logic samples. Data obtained over many test cycles while the DUT was intermittently failing the test is shown in FIG. 5C.

Figure 5D:
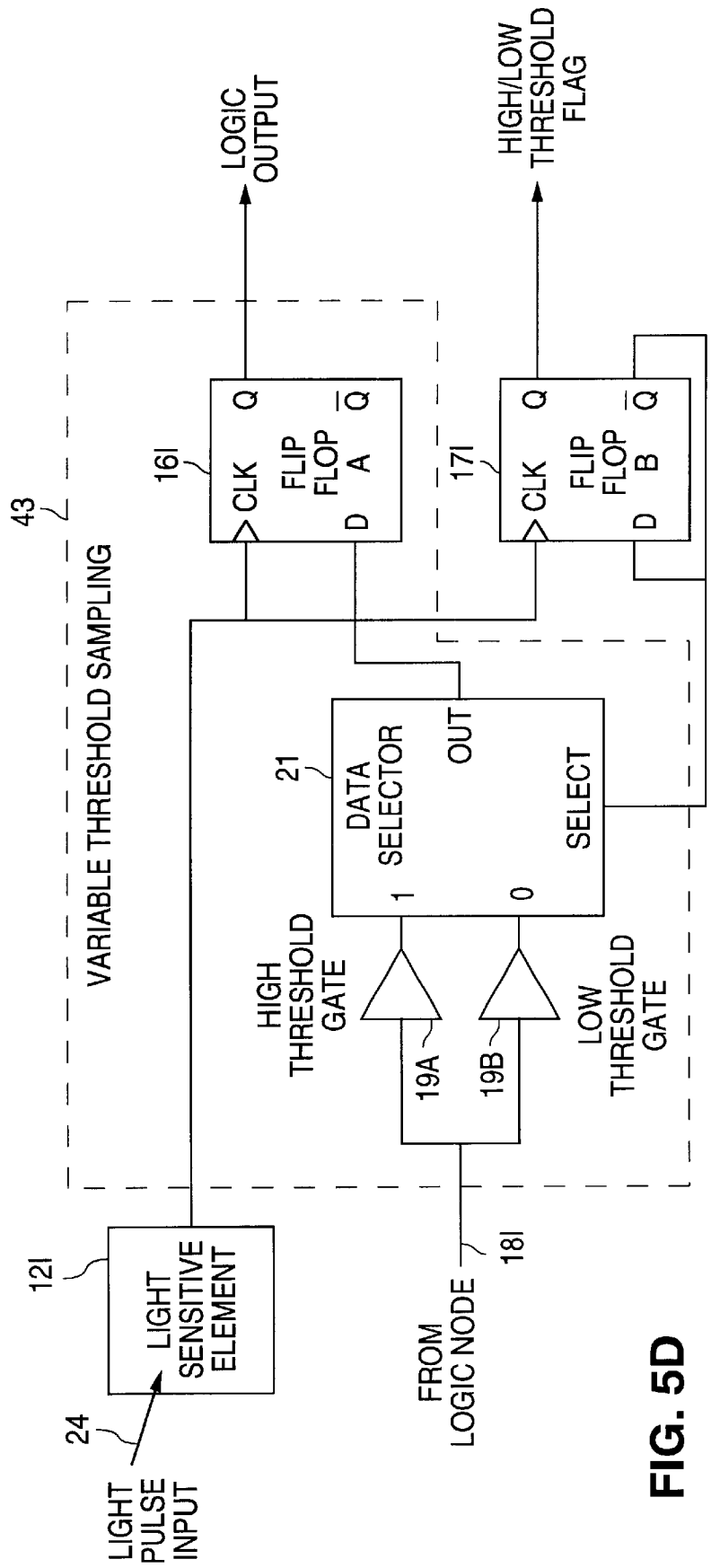
FIG. 5D is a schematic diagram of circuitry to detect logic level between a high threshold and a low threshold.

FIG. 5D shows in one embodiment circuitry to detect an incorrect logic level, which in addition to the circuitry shown in FIG. 1 is incorporated on DUT 10. A signal generated by incident light pulse 24 is used to clock flip-flops 16I and 17I. Flip-flop 16I functions the same as described above with reference to FIG. 1 and samples the logic state of the data selector 21 output signal at the instant of the light pulse 24. Logic node 18I is coupled to the input terminals of logic gates 19A and 19B, gate 19A having a high logic threshold and gate 19B having a low logic threshold. The output terminals of gates 19A and 19B are coupled to data selector 21. Data selector 21 selects the high threshold or the low threshold based upon the select signal from flip-flop 17I. The select signal from flip-flop 17I changes its state from high to low or low to high with every light pulse 24. Thus the high threshold and the low threshold are used by the data selector 21 alternately to detect the stage of logic node 18I. The output signal Q of flip-flop 17I is made available to the analysis apparatus as a threshold flag thereby providing the information as to what threshold was used when a particular state of logic node 18I was recorded.

Figure 5E:
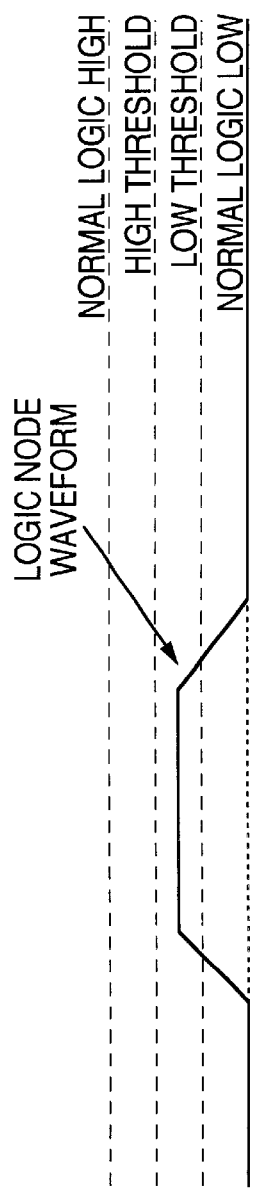
FIG. 5E is a timing diagram illustrating operation of the FIG. 5D circuitry.

Waveforms shown in FIG. 5E show how an incorrect high level logic state at node 18I is detected. The logic transition passes through the threshold of gate 19B but does not pass through threshold of gate 19A. The rise or fall times of full voltage logic transitions on node 18I can also be estimated by subtracting the recorded times when the logic state of node 18I passed the through high and low threshold points.

When the DUT test pattern is long, it would be advantageous to be able to sample the logic nodes of interest several times during one cycle of the pattern, as this will reduce the total time taken to build a logic waveform of the node. For example, it would be an advantage to capture many samples of a logic node in a time period of, e.g., 100 ns or less, during one cycle of a test pattern which is longer than a few microseconds. The light sensitive element, which converts the incident light pulses into logic sampling pulses, will generally have a slow recovery time, of many nanoseconds, during which it will not respond to another light pulse.

Figure 5F:
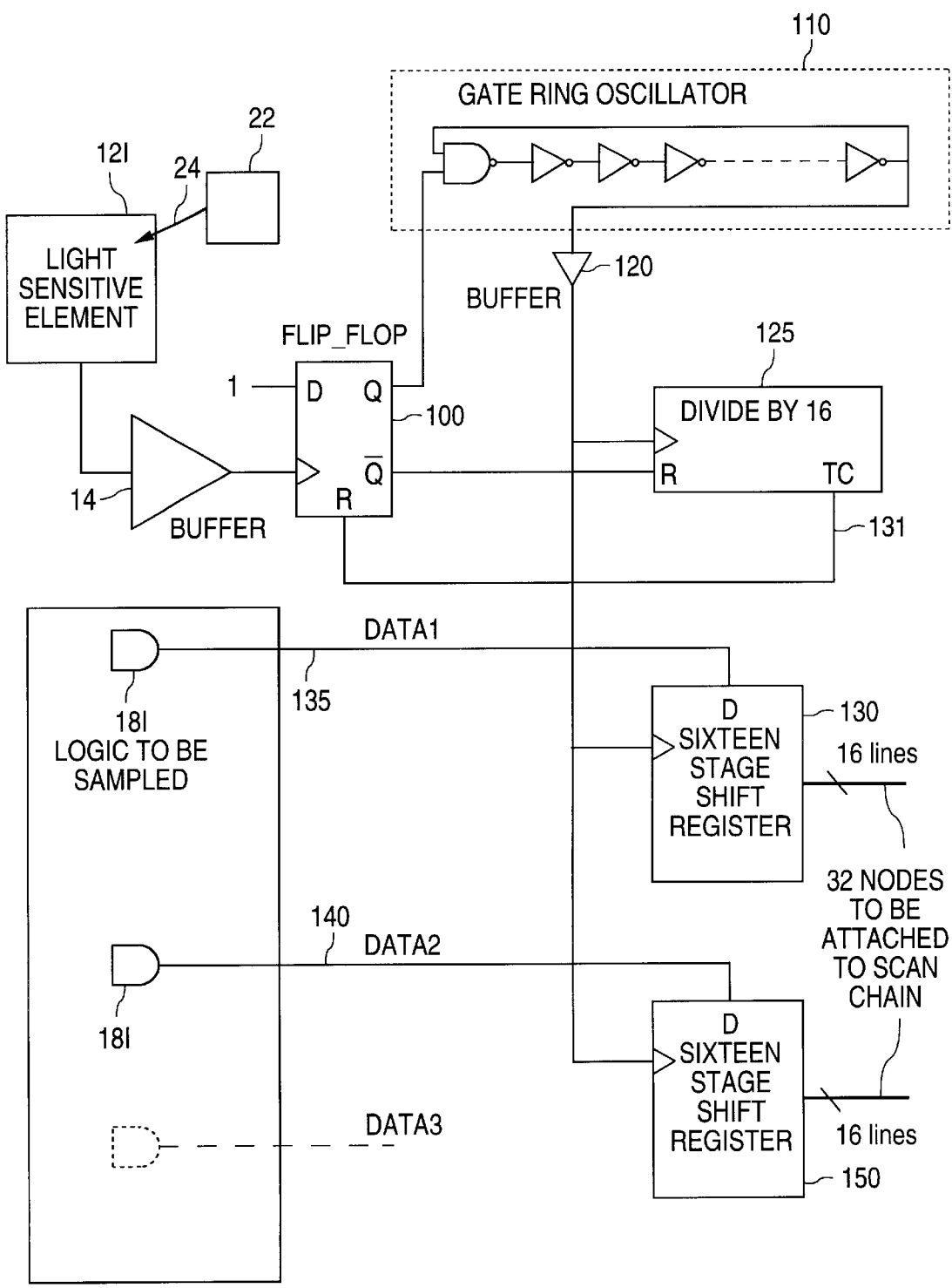
FIG. 5F is a schematic diagram of a circuit allowing high speed sampling.

FIG. 5F shows a circuit in which this limitation is overcome, so that the samples can be taken as quickly as the IC logic speed allows. Light source 22 generates a light pulse 24 and focuses it on to light sensitive element 12, the output terminal of which is connected to Schmitt trigger 14, as previously described. The pulse output of trigger 14 is connected to the clock input terminal of flip-flop 100, so that light pulse 24 causes the Q output signal of flip-flop 100 to go to a logic high, so starting the gated ring oscillator 110. The delay time around the oscillator ring 110 is chosen (by the number of stages in the ring) so that the oscillation period is high but well within the clock frequency specification of the DUT. For example, for a DUT capable of operating at 1 GHz clock rate, the oscillation frequency would be chosen to be 500 MHz or less. When the gated oscillator 110 starts, clock pulses generated by it are propagated via buffer 120 to the clock inputs of a divider circuit 125, shown here as a divide by 16, and at least one shift register 130. Also when the flip-flop 100 starts oscillator 110, a reset is removed from divider 125. The divider 125 will count, in this example, 16 clock pulses before generating terminal count 132 (this number of pulses is for illustration only, the actual number may be larger or smaller). Terminal count 132 is applied to the reset terminal of the flip-flop 100, so resetting flip-flop 100, and stopping the oscillator 110 after it has generated 16 clock pulses. (The gated oscillator will not start again until another light pulse is received). Shift register 130 will receive 16 clock pulses on its clock input terminal for every occurrence of the light pulse 24. The data input terminal of shift register 130 is connected to a logic node 18I to be sampled so that 16 samples of the logic state 135 of node 18I will be stored in shift register 130. The output signals of all 16 stages of the shift register 130 are made available to be connected into the DUT scan chain. The advantage of this arrangement is that one light pulse 24 will result in many samples being taken within a few nanoseconds. A second node 18J shown as providing signal 140, Data2, can also be sampled simultaneously, e.g., by shift register 150, and the method can in principle be extended to many logic nodes. It will be appreciated that the exact frequency of the gated ring oscillator 110 cannot be known very accurately due to inevitable variation in the propagation delay of the gates in the ring 110. This means that the time positions of the logic transitions will not be known very accurately. This situation may be improved by using the DUT clock as one of the sampled nodes. Then the data analysis apparatus that receives the scan chain output data has available a definite time reference (the sampled clock data) which can be used to determine more accurately the time of logic transitions on other sampled nodes.

Figure 6:
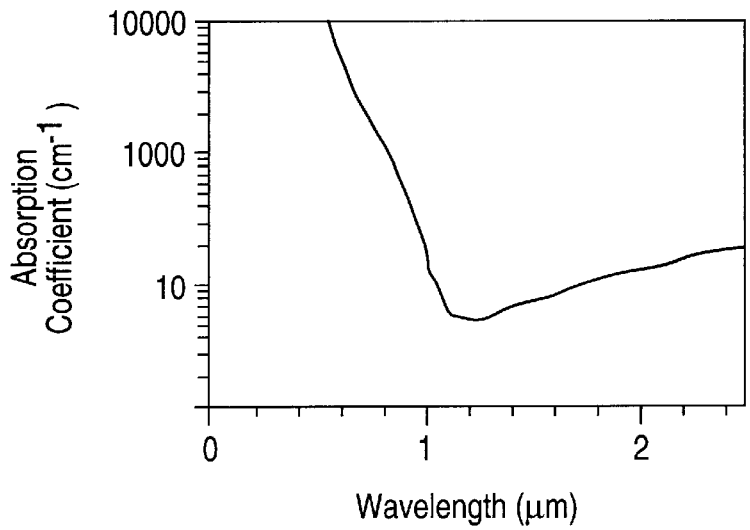
FIG. 6 is a diagram showing how absorption of light in silicon varies with the wavelength of the light.
Figure 7:
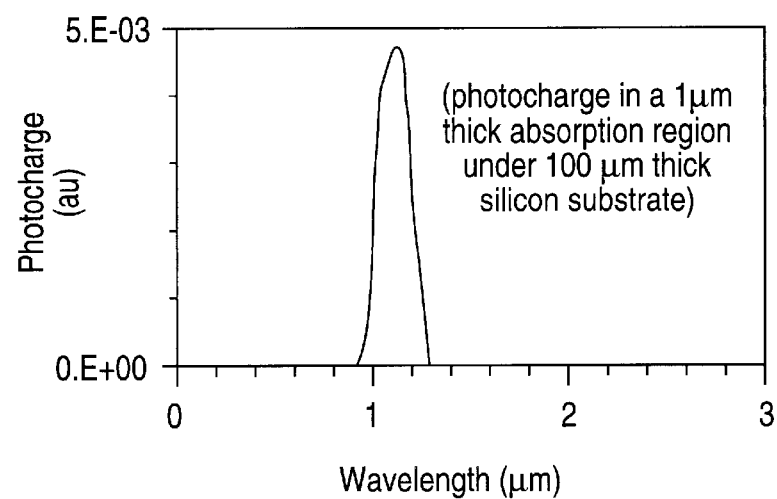
FIG. 7 shows variation in photocharge in a 1 $\mu$m thick absorption region under 100 $\mu$m hick silicon substrate around 1 $\mu$m wavelength.

For testing flip-chip mounted devices, light pulse 24 propagates through the DUT die to be able to interact with the DUT light sensitive elements. Most present day ICs are formed on a doped crystalline silicon die substrate. FIG. 6 shows how the attenuation of light propagating through such silicon varies with wavelength. This absorption of the light also generates current in light sensitive element 12; which is for example a reverse biased semiconductor diode (PN junction). The photoelectric effect of light increases as the light wavelength is reduced. The combination of these two effects for a diode on a 100 $\mu$m thick die shows that the photoelectric effects peaks at around 1.05 $\mu$m wavelength (see FIG. 7).

One suitable light source 22 of pulse 24 is a conventional And:YAG laser, which outputs light of wavelength 1.064 $\mu$m. An actively Q switched And:YAG laser is especially suitable. This laser produces a short duration (e.g. 0.5 nanoseconds) light pulse output when an electrical trigger signal is applied to it. A laser of this type is described in J. J. Zayhowski and C. Dill III, "Coupled-cavity electro-optically Q-switched And:YVO$_4$ microchip lasers," Opt. Lett. 20, pp. 716–718, Apr. 1, 1995 and J. J. Zayhowski and C. Dill III, "Diode-pumped microchip lasers electro-optically Q switched at high pulse repetition rates," Opt. Lett. 17, pp. 1201–1203, Sep. 1, 1992, both incorporated by reference in their entireties.

Other techniques can be used to produce a single laser pulse from a continuously running laser. For example, a single pulse can be selected by an electrical trigger from the pulse train of a 100 MHz Nd:YAG laser (see U.S. Pat. No. 5,905,577, incorporated herein by reference in its entirety). Also an electrically triggered short high energy pulse can be obtained from a mode locked laser by "cavity dumping". A cavity dumped laser system (called the Tiger-CD) is available from Time-Bandwidth Products. Cavity dumping is discussed in H. A. Kruegle and L. Klein, "High peak power output, high PRF by cavity dumping a Nd:YAG laser," Appl. Optics 15, 466–471 (February 1976) and Anthony E. Siegman, "Lasers" pp. 975–979, University Science Books, 1986, both incorporated by reference in their entireties.

Alternatively, if very short (less than 200 fs) 1.3 $\mu$m wavelength laser pulses of moderate total energy are used, the photon density at the beam focus is such as to produce a strong two-photon effect which creates electron-hole pairs efficiently (see Chris Xu and Winfried Denk, "Two-photon optical beam induced current imaging through the backside of integrated circuits", Appl. Phys. Lett 71. p. 18, Nov. 3, 1997, incorporated by reference in its entirety). Thereby a strong photo current could be induced in the light sensitive element while avoiding excessive transmission losses in the silicon substrate.

Light sensitive elements such as 12I require a minimum light pulse energy to generate a logic pulse output. For reliable operation the light pulse energy must be well above this minimum energy value. There is also a light pulse energy level that undesirably will heat each element 12I enough to cause a change in its diffusion profiles or associated metal contact structures. To prevent such damage, the light pulse energy must be well below this value.

Figure 8A:
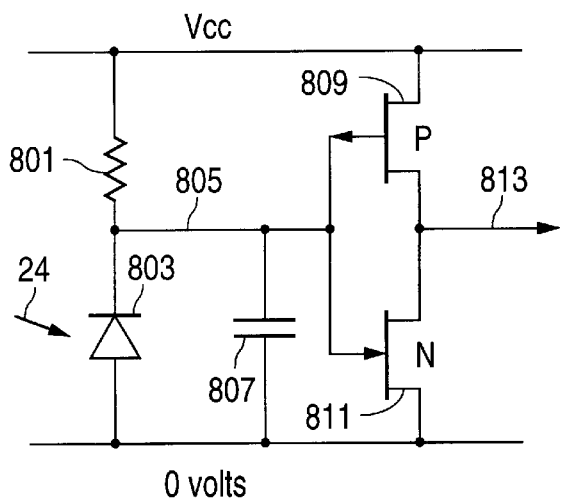
FIG. 8A shows a light switching circuit.

FIG. 8A shows one implementation of a basic light switching circuit discussed in further detail below. Using semiconductor fabrication process parameters typical for a 0.6 cm CMOS process, for the circuit shown in FIG. 8A schematically the lower energy limit for correct operation is calculated to be $3.3 \times 10^{-11}$ Joules and the upper energy limit avoiding damage is calculated to be $0.54 \times 10^{-6}$ Joules. The complete calculation is shown below.

In this embodiment, the light sensitive element 12I is a diode (photodiode) conventionally formed by an N doped diffusion into a P doped crystalline silicon substrate (or vice versa) to provide what is, in a standard CMOS semiconductor process, the drain region of an N channel FET (field effect transistor). It has been determined that although such a diode has adequate photoelectric properties, other suitable P-N junctions may also serve as the photodiode. Photons from the light pulse with energy equal or more than the bandgap of the silicon create electron-hole pairs (band-to-band absorption) while propagating through the diode. These carriers generated by the incident photons result in a current consisting of two components. One component is due to the drift of carriers (electrons and holes) generated in and around a small volume including the depletion region. The other component is from the diffusion of minority carriers into the depletion region:

$$J = J_{dr} + J_{diffusion} \quad (1)$$

Where J is total current density, $J_{dr}$ is drift current density and $J_{diff}$ is diffusion current density. The drift current flows through quickly and the diffusion current flows through slowly.

An approximate expressions (see Physics of Semiconductor Devices, S. M. Sze, 1991) for the fast component $J_{dr}$ of photo current density is:

$$J = q \times \phi_0 (1 - \exp(-\alpha(L))) = q \times \phi_0 (\alpha \times L) \text{ for } \alpha \times L \ll 1. \quad (2)$$

where q is the electron charge, $\phi_0$ is the photon flux per unit area (photon number/sec/area) incident at the junction, $\alpha$ is the absorption coefficient for the particular wavelength of the incident light, and L is the thickness of the absorption region around the depletion region. In this calculation L is arbitrarily chosen to be small enough that essentially all the photo carriers generated in this region will quickly flow through the depletion region and create a fast rising photo current and thus a fast changing voltage on the node. Carriers diffusing slowly into the junction caused by absorption further away can be ignored as they will arrive after the node has changed its logic state.

The $\alpha$ for band-to-band absorption at 1.06 $\mu$m wavelength is, e.g., about 10 cm$^{-1}$ and is not affected significantly by doping level (see Physics of Semiconductor Devices, S. M. Sze 1991):
For L about 1 $\mu$m, the drift and diffusion process is very fast, i.e. about 100 ps:

$$\alpha L = 1 \times 10^{-3} \quad (3)$$

Substituting Eq. 3 in Eq. 2 gives:

$$J = q \times \phi_0 \times 10^{-3} \quad (4)$$

and $$I = J \times A = q \times A \times \phi_0 \times 10^{-3} \quad (5)$$

where A is the area of diode in m$^2$ and I is the total current. If the laser beam spot size is the same as the diode area then $A \times \phi_0$ = total photon flux (number of photons per second). The diode and the cross section of the focused beam pulse can be, for example, 3 $\mu$m×3 $\mu$m in area. Total photo generated charge is:

$$Q = I_t \times t \quad (6)$$

where t is the duration of current pulse $I_t$.
Thus total charge Q is:

$$Q = q \times A \times \phi_0 \times t \times 10^{-3} \quad (7)$$

But $A \times \phi_0 \times t$ = total number of photons in the light pulse and the energy of each photon of 1.064 $\mu$m wavelength is 1.17 eV Therefore the total energy, Ep, in the light pulse in joules is:

$$Ep = 1.17 \times q \times A \times \phi_0 \times t \text{ joules} \quad (8)$$

So that $$Q = (Ep \times 10^{-3})/1.17 \text{ coulombs} \quad (9)$$

Therefore the total photo-generated charge Q though the diode caused by a light pulse of total energy Ep approximately is:

$$Q = Ep \times 10^{-3} \text{ coulombs} \quad (10)$$

This charge will cause a voltage change of $\Delta V$ across the circuit node capacitance Cn represented by capacitor 807 in FIG. 8A such that:

$$\Delta V = Q/Cn = Ep 10^{-3}/Cn \quad (12)$$

This voltage change must be at least equal or greater to one half the integrated circuit supply voltage, Vcc, to provide a logic switching signal. Thus, $$\Delta V > Vcc/2$$

Therefore:

$$Ep \times 10^{-3}/Cn > Vcc/2$$

$$Ep > (Vcc \times Cn)/2 \times 10^{-3}$$

For example, if Vcc is 3.3V and the node capacitance is 30 fF, the required minimum light pulse energy passing through the diode junction is:

$$Ep = (3.3 \times 30^{-15})/2 \times 10^{-3} = 4.95 \times 10^{-11} \text{ joules} \quad (13)$$

For the 0.6 $\mu$m CMOS process circuit shown in FIG. 8A, assume a channel width of 1.2 $\mu$m for the NMOS transistor 811 and channel width of 2 $\mu$m for PMOS transistor 809 and a gate oxide capacitance $C_{ox}$=3.7 fF/$\mu$m$^2$. The channel length of both transistors is assumed to be 0.6 $\mu$m. The substrate doping level is ~5×10$^{16}$/cm$^3$. From Physics of Semiconductor Devices, S. M. Sze, 1991, the total absorption coefficient (band-to-band and free-carrier absorption) is approximately 30 cm$^{-1}$ for a doping level of 5×10$^{18}$/cm$^3$ and will be lower for the doping level of 5×10$^{16}$/cm$^3$ assumed for the 0.6 $\mu$m CMOS process.

The total gate input capacitance for circuit shown in FIG. 8A is then defined as $$C_{input} = C_{ox}(\text{Total channel width in } \mu\text{m}) \times 0.6 = 3 \times 7 \times (1.2 + 2) \times 0.6 = 7.1 \text{ fF}.$$

Diode 803 capacitance can be calculated as follows:
Diode 803 depletion capacitance=$\epsilon_{Si}$/Junction thickness, where $\epsilon_{Si}$ is the silicon permitivity of the silicon forming diode 803.
The typical depletion region thickness for the diode is 0.1 $\mu$m, So that diode 803 depletion capacitance=1.2×10$^{-12}$/0.1×10$^{-4}$=1.20 fF/$\mu$m$^2$. (14)

Therefore, for a diode of 3 $\mu$m by 3 $\mu$m (9 $\mu$m$^2$ the diode capacitance is 10.81 ff.

The metal interconnect capacitance and resistor 801 capacitance can be assumed to be less than 10 fF, giving a total node capacitance at the photodiode 803 of less than 30 fF.

Excessive laser pulse energy can damage the integrated circuit. The damage is caused by heating a volume of the die above about 200° C. For silicon, specific heat=0.7 J/g.° C.=1.61 J/cm$^3$.° C. (See Physics of Semiconductor Devices, S. M. Sze 1991). Assume the light pulse is focussed completely through a waist of 9 $\mu$m$^2$ cross-section area and, arbitrarily, 2 $\mu$m thickness, i.e. absorption volume is approximately 20 $\mu$m$^3$ and that the ambient temperature of the silicon is 100° C.:

Temperature change $\Delta$T=Absorbed energy/(Specific heat×Absorption volume).

Absorbed energy required to change temperature by 100° C.=1.61×20×10$^{-12}$100=3.22×10$^{-9}$J.

Absorbed energy=Energy in a pulse×Absorption coefficient×Absorption length.

Therefore, the energy level of the incident light pulse required to cause damage is greater than=3.22×10$^{-9}$/(30×2×10$^{-4}$)=0.54×10$^{-6}$ Joule.

It is advisable to operate well above the minimum light pulse energy required, so that performance is not affected by small variations in pulse energy. Twenty times the minimum pulse energy could be used, from the example, 1×10$^{-10}$ Joule. It should be noted that this is still about 500 times less than the energy required to damage the photosensitive element 803.

Self testing of the circuitry associated with testing of DUT 10 can be done to verify that the circuitry is performing as expected. FIG. 9 shows schematically how a self-test function is performed. In normal operation, a data selector 50 allows one of internal logic circuits 18I to drive the signal input to the D terminal of flip-flop 16I. In test mode, the inverted Q output signal of flip flop 16I on line 37 is coupled back to the D input terminal of flip-flop 16I via data selector 50. This causes flip-flop 16 to change state after every clock pulse if the circuit is performing properly.

Figure 10:
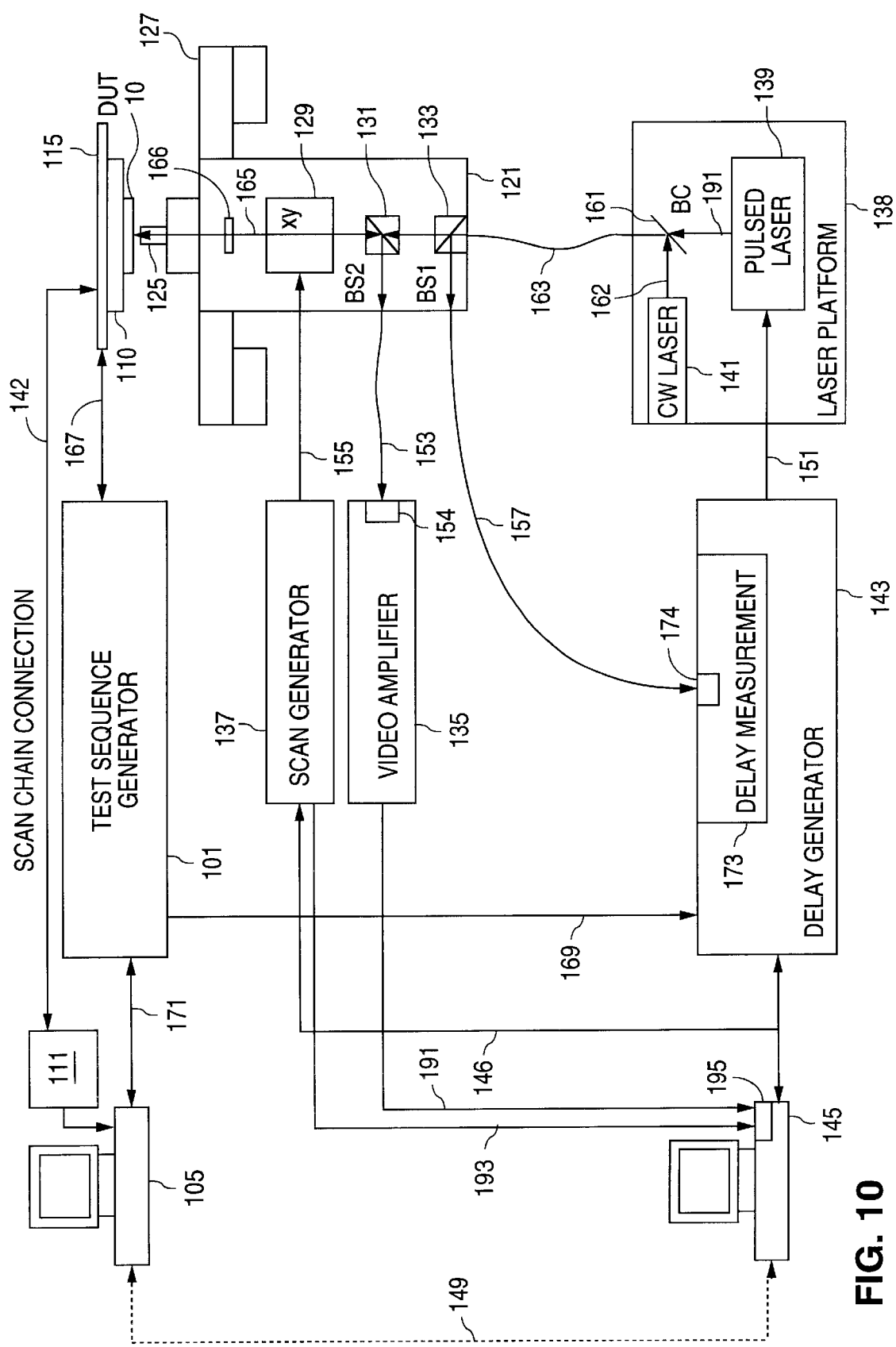
FIG. 10 illustrates a test apparatus to test the device under test.

FIG. 10 shows in block diagram how the test apparatus is arranged in a test setup. A conventional integrated circuit tester 101, such as a Schlumberger model number ITS9000KX, transmits a digital test pattern via multiple connecting cables 167, printed circuit board 115, device under test package 110, to the flip-chip mounted DUT 10. DUT 10 responds to these incoming signals and transmits signals back to tester 101 over the same path. Tester 101 is under the control of computer workstation 105 via communications link 171, so that the test pattern can be repeated any number of times. Workstation 105 can also send commands to tester 101 to read back scan chain 42 (not shown) on connection 142 or other latching device or circuit inside DUT 10. An alternative is for workstation 105 to more directly access scan chain 42 via an interface circuit 111.

Tester 101 generates a trigger pulse at a fixed point in the test pattern sequence, the particular position being chosen by the test operator. This trigger pulse is carried via line 169 to delay generator 143. Delay generator 143 is under the control of second workstation 145. Workstation 145 programs delay generator 143 to produce an electrical output pulse on line 151 delayed from the trigger on line 169.

The delayed pulse on line 151 is routed to pulsed laser 139, located on laser platform 138. Laser 139 produces a short pulse of polarized light in response to electrical output pulse on line 151. The light pulse passes through beam combiner 161, into optical fiber 163, and hence to laser scanning microscope (LSM) 121, of a type similar to those manufactured by Checkpoint Technologies. The operation of this LSM 121 to produce a scanned image and to accurately position and focus a stationary beam are described in detail in U.S. Pat. No. 5,905,577. At LSM 121 the polarized light pulse exits the optical fiber 163, and passes to beam splitter 133, which deflects a small part of the beam into optical fiber 157, and passes the remainder to polarized beam splitter 131. The polarization of beam splitter 131 is arranged so that the light pulse passes through it unattenuated to the XY deflection mirrors 129. The mirror positions are controlled by workstation 145 via scan generator 137. The deflected light then passes through quarter wave plate 166 and through focussing objective lens 125. The light pulse exits LSM 121, and comes to a focus on a selected light sensitive element in DUT 10. The vertical position of focus is adjusted to bring the beam to a focus after it has passed almost completely through the DUT 10 substrate, so that the beam "waist" is in the region of the structure forming the targeted light sensitive element 12 (not shown here).

The maximum field of view provided by LSM 121 with a high power, e.g., 100 power objective lens is only about 200×$\mu$m 200 $\mu$m. By changing the objective lens to a lower power, e.g., 10 power, a wider field of view can be obtained. Also LSM 121 assembly is mounted on a mechanical XY stage 127, which can be moved by, e.g., ±25 mm relative to DUT 10. Thus LSM 121 can be positioned so that the (high power) lens 125 can be used to guide the light beam 165 to any part of DUT 10 which is smaller than, e.g., 50 mm×50 mm.

Workstation 105 commands tester 101 to send a test pattern to DUT 10. Tester 101 sends a test pattern to DUT 10 and also sends a trigger signal to delay generator 143. The trigger signal corresponds to a precise point in the test pattern. The trigger signal from tester 101 causes delay generator 143 to produce a delayed electrical output pulse on line 151, which produces a single light pulse from laser 139. This light pulse is guided by LSM 121 to the light sensitive element on DUT 10. The light pulse causes the latching of the logic circuit 18I (FIG. 3) data at this instant into an on-chip flip-flop 16I (see FIG. 3). The test pattern is completed. Workstation 105 then accesses the data held in the light clocked on-chip flip-flop 16I via commands sent to tester 101, or alternatively more directly via interface circuit 111. Workstation 105 then sends the data received from flip-flop 16I to workstation 145, via data link 149. On receiving the data, workstation 145 changes the delay of delay generator 143 slightly, and informs workstation 105 that another test pattern can be run. This sequence can be repeated as many times as required, until data has been obtained covering the time period of interest. The light clocked data received by workstation 145 can be assembled in one of its display console windows as a logic state plotted against time, for example see FIG. 5C. The same sequence can be repeated with the light pulse aimed at different light sensitive elements 12 inside DUT 10. By this process many logic waveforms can be compared accurately in time.

The LSM 121 can also produce a raster scanned image of the DUT 10 which may be used to locate the light sensitive elements on DUT 10 and aim the light pulse from laser 139 accurately at these targets. For this imaging mode, pulsed laser 139 is turned off and CW laser 141 turned on. Polarized light beam 162 from CW laser 141 is incident on beam combiner 161 and sent to LSM 121 on fiber 163. This beam passes through the LSM 121 to DUT 10 as previously described. Light reflected from the DUT 10 returns through objective lens 125, quarter wave plate 166 and deflection mirrors 129 to polarized beam splitter 131. The a polarization of the reflected light has been rotated by passing twice through the quarter wave plate 166 so that it is diverted by polarized beam splitter 131 into fiber 153 and sent to photo diode 154. The photo diode 154 produces an electrical signal proportional to the reflected light intensity. The workstation 145 commands the scan generator to raster scan the focussed beam in an area of the DUT 10, the reflected light falling on photo diode 154 then produces a video signal which is amplified by video amplifier 135. Frame grabber 195 in workstation 145 receives the X and Y scan synchronization signals from the XY scan generator 137 and also the video signals from amplifier 135. The image output of the frame grabber 195 is displayed on the console of workstation 145. The operator of workstation 145 can move a cursor on this image. The cursor marks the point where the light pulse from laser 139 will be focussed when it is turned on.

The maximum field of view provided by LSM 121 with a high power, e.g., 100 power objective lens 125, is only about 200 mm×200 mm. By changing the lens 125 to a low power, e.g., 10 power, a wider field of view can be obtained but at lower optical resolution. Also, LSM 121 assembly is mounted on a mechanical stage 127 which can be moved by, e.g.,+/−25 mm relative to DUT 10. Thus LSM 121 can be positioned so that the lens 125 can be used to guide the beam from laser 139 to any part of a DUT 10 which is smaller than 50 mm×50 mm.

Pulsed laser 139 may have a variable delay or jitter between the application of electrical output on line 151 and the light pulse output. It was noted previously that beam splitter 133 deflected a portion of the light pulse into optical fiber 157. The light pulse in fiber 157 is incident on a light sensitive element 174 that produces an electrical output signal. This output signal is used by delay measurement circuit 173 to accurately measure the delay between the trigger pulse and the corresponding light pulse from laser 139. The plotted time positions of the light clocked data can then be adjusted before being displayed by workstation 145. The jitter requirements for laser 139 are greatly relaxed when adjustment to the time position of sampled data is made.

Figure 8B:
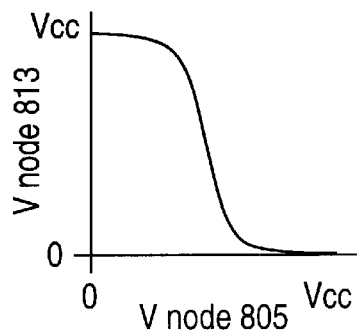
FIG. 8B shows DC characteristics of the inverter shown in FIG. 8A.
Figure 8C:
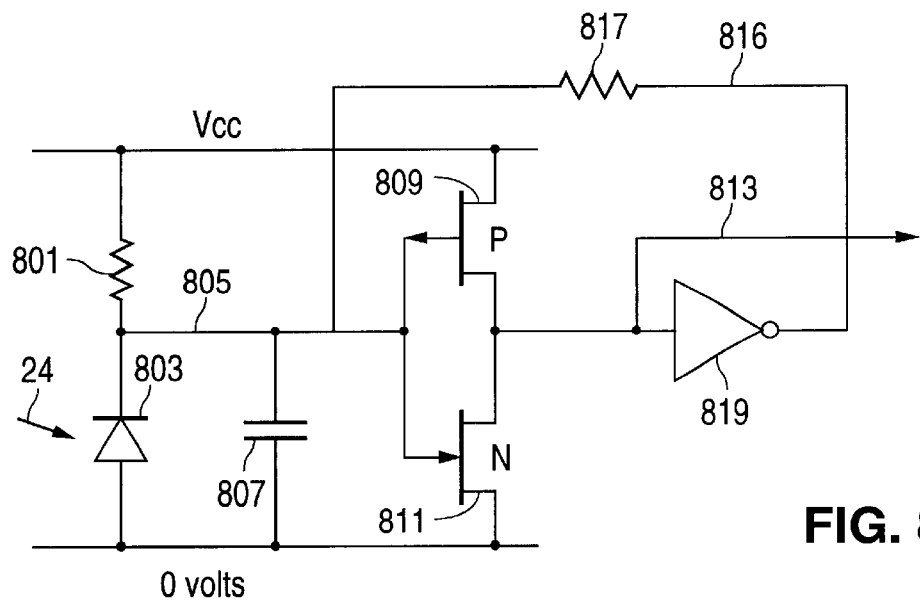
FIG. 8C shows a light switching circuit having hysteresis.
Figure 8D:
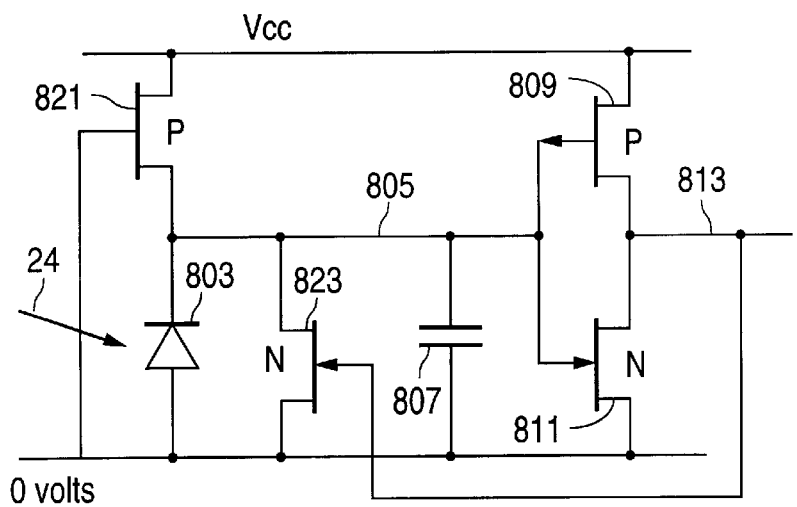
FIG. 8D shows an all CMOS light switching circuit having hysteresis.

FIGS. 8A, 8C and 8D are examples of on-chip circuitry in accordance with this disclosure. FIG. 8A shows a light switching circuit having P channel FET 809 and N channel FET 811 forming a standard complementary metal oxide semiconductor (CMOS) logic inverting circuit. The DC relationship between node 805 voltage and output node 813 voltage is shown graphically in FIG. 8B for the circuit of FIG. 8A. Resistor 801 provides reverse bias to photodiode 803 (the same as element 121), so that in the absence of light, the voltage at node 805 is equal to the supply voltage Vcc, and the output voltage at node 813 is 0V. The total node capacitance of all the devices connected to node 805 is represented by capacitor 807. When light pulse 24 is incident on diode 803, current flows such as to discharge capacitor 807 negatively. It can be seen from FIG. 8B that as the voltage at node 805 falls below one half of Vcc, the voltage at output node 813 rises to above one half of Vcc. The discharge current produced by the light pulse is sufficiently large to be able to change node 805 voltage rapidly, for example in 1 ns, from Vcc to well below one half Vcc. It can be seen from FIG. 8B that the inverter 809, 811 shows gain at around one half Vcc, so that as node 805 voltage changes in, e.g., 1 ns, output node 813 will switch from 0 volts to Vcc more quickly, e.g., in 0.2 ns. A positive logic pulse of this rise time will be suitable to act as the clock pulse of a standard CMOS "D" flip-flop 16I (FIG. 3). It should be noted that for correct operation, light pulse 24 has a well defined minimum energy, which is the energy required to discharge capacitor 807 to just below one half Vcc. It should also be noted that light pulse 24 does not have a well defined upper limit on its energy for correct operation, the only obvious limit being the "damage threshold" of the substrate to a single powerful light pulse as described above. This threshold is many orders of magnitude greater than the minimum energy needed for the electrical function. The calculation of upper and lower limits for light pulse energy was discussed previously. Use of a light pulse energy that is ten or more times greater than the minimum allows very great latitude in laser power stability and accuracy of placing the beam on the light sensitive elements without sacrificing timing accuracy.

FIG. 8C shows the light switching circuit of FIG. 8A with an added hysteresis feature. FIG. 8D is an alternative implementation of the circuit shown in FIG. 8C and can be used in place of circuit shown in FIG. 8C. The circuits shown in FIG. 8C or 8D are used on-chip on DUT 10. The DC relationship between node 805 voltage (of FIGS. 8C and 8D) and output node 813 voltage (of FIGS. 8C and 8D) is shown graphically in FIG. 8E.

After the light pulse, node 805 will start to charge positive by current flowing in resistor 801. In principle node 805 can be charged very slowly, but there is a possibility in some cases that the inverter 809, 811 will start to oscillate, thereby producing multiple pulses on node 813. To prevent this, hysteresis (as in a Schmitt trigger), or a small amount of positive feedback, can be provided as is known in the art, by adding inverter 819, and resistor 817 as shown in FIG. 8C.

These additions modify the action of the circuit shown in FIG. 8C in the following way: In the absence of a light pulse, node 813 is at 0 volts and the output signal of inverter, 819 is at Vcc. The potential divider consisting of resistors 801 and 817 sets the reverse bias voltage on diode 803. Resistor 817 is greater in value than resistor 801. When light pulse 24 is incident on diode 803, capacitor 807 is discharged below one half Vcc, causing node 813 to go rapidly to Vcc, and node 816 to fall rapidly to 0 volts. It can be seen that with node 816 at 0 volts, the current through resistor 817 will be added to the current from diode 803 to help discharge node 805 more quickly. When light pulse 815 has ended, node 805 will start to charge through resistor 801, and when 805 reaches approximately one half of Vcc node 813 will begin to fall from Vcc towards 0 volts, causing the output of the inverter 819 to rise rapidly. This action is regenerative as the current through resistor 817 will now charge node 805 more rapidly positive. By this means a more rapid positive transition of node 813 is achieved, with the possibility of oscillation very greatly reduced.

The large value resistors, e.g., 10 k ohms or greater) to implement the circuits of FIG. 8A and FIG. 8C occupy a large area of the die of DUT 10. An alternative circuit using only transistors is shown in FIG. 8D, where bias resistor 801 is replaced by P channel FET 821, and inverter 819 and resistor 817 are replaced by N channel FET 823. FET 821 is always biased so that it conducts. In the absence of an incident light pulse, the current through 821 will charge node 805 positive until its voltage is essentially equal to Vcc. The output voltage of the inverter formed by FETs 809 and 811 is at 0 volts, turning off N channel FET voltage 823. When a light pulse is incident on diode 803, diode 803 will conduct a current that is larger than the saturation current of FET 821. The capacitor 807 then begins to discharge towards 0 volts. As node 805 falls below one half of Vcc, output node 813 goes positive, turning on FET 823, and increasing the rate of discharge of capacitor 807, until node 807 is at 0 volts. When the light pulse is completed (at zero amplitude), diode 803 current goes to zero, and node 805 is charged positive by the difference between the saturation current of FET 821 and FET 823. The geometry of these transistors is chosen such that the saturation current of FET 821 is several times larger than that of FET 823. When node 807 reaches about one half of Vcc, the voltage at node 813 goes towards 0 volts, turning off FET 823 and so increasing the rate of the voltage rise on node 805.

The embodiments described above are exemplary only. Variations will be apparent to those skilled in the art in view of the above disclosure, and the invention is limited only by the following claims.

I claim:

1. A method of testing an integrated circuit, comprising the acts of:

proving a first photosensitive element on a principal surface of the integrated circuit;

coupling the first photosensitive element to a first storage element on the integrated circuit;

coupling a first circuit node of the integrated circuit to the storage element;

directing a first pulsed light beam to the first photosensitive element;

storing an electrical state of the circuit node in the first storage element in response to the first pulsed light beam;

providing a second photosensitive element on a principal surface of the integrated circuit;

coupling the second photosensitive element to a second storage element on the integrated circuit;

coupling a second circuit node of the integrated circuit to the second storage element;

directing a second pulsed light beam to the second photosensitive element;

storing an electrical state of the second circuit node in the second storage element in response to the second pulsed light beam; and determining a fixed temporal relationship between the pulsed light beams and the electrical state of the circuit nodes.

2. The method of claim 1, wherein each photosensitive element is coupled to a clock terminal at the respective storage element.

3. The method of claim 2, further comprising the act of shaping a signal transmitted by each photosensitive element to the respective storage element.

4. The method of claim 3, further comprising the act of providing hysteresis during the act of shaping.

5. The method of claim 1, wherein both the storage elements are clocked by the respective photosensitive elements at about the same time.

6. The method of claim 1, wherein the first storage element is a flip-flop.

7. The method of claim 1, further comprising the act of transferring the stored electrical state of each circuit node external to the integrated circuit.

8. The method of claim 1, further comprising the act of transferring the stored electrical state of each circuit node to a scan chain.

9. The method of claim 1, further comprising the acts of:

providing a data selector;

coupling a plurality of the circuit nodes of the integrated circuit to the data selector;

coupling the data selector to the storage elements; and storing the electrical state of the selected circuit node in one of the storage elements.

10. The method of claim 1, further comprising the acts of:

providing a high threshold and a low threshold for detecting the electrical state of each circuit node;

alternatively selecting the big threshold and the low threshold for detecting the electrical state of each circuit node; and storing the detected electrical state in one of the storage elements.

11. The method of claim 1, wherein the first photosensitive element is a PN junction in the integrated circuit substrate.

12. A circuit for capturing an electrical state of a circuit node of an integrated circuit, the integrated circuit being formed on a principal surface of a substrate, the circuit being on the substrate and comprising:

a first and second storage element;

a first and second photosensitive element, an output terminal of each photosensitive element being coupled to the respective storage element; and a first and second circuit node of the integrated circuit, each circuit node being coupled to the respective storage element, wherein each storage element stores an electrical state of the respective circuit node in response to a light beam directed onto the respective photosensitive element; and means for determining a fixed temporal relationship between the light beams and the electrical state of the respective circuit nodes.

13. The circuit of claim 12, wherein the surface of the substrate opposite the principal surface is transmissive to light incident thereon, and wherein the incident light passes from the opposite surface through the substrate to the photoresistive elements.

14. The circuit of claim 12, further comprising a trigger element coupled to the first storage element and the first photosensitive element.

15. The circuit of claim 12, further comprising a data selector coupled to at least one circuit node and the respective storage element.

16. The circuit of claim 12, wherein the first photosensitive element is a PN junction in the substrate.

* * * * *